(12) United States Patent
Clovis

(10) Patent No.: US 8,111,800 B2
(45) Date of Patent: Feb. 7, 2012

(54) FREQUENCY RATIO DETECTION

(75) Inventor: Philip Michael Clovis, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 1050 days.

(21) Appl. No.: 12/019,171

(22) Filed: Jan. 24, 2008

(65) Prior Publication Data
US 2009/0190707 A1   Jul. 30, 2009

(51) Int. Cl.
H03D 3/24   (2006.01)

(52) U.S. Cl. ........................................ 375/376

(58) Field of Classification Search .................. 375/354, 375/371, 373, 375, 376
See application file for complete search history.

(56) References Cited

U.S. PATENT DOCUMENTS

| | | | |
|---|---|---|---|
| 7,239,612 B1* | 7/2007 | Cole et al. | 370/230.1 |
| 2005/0068111 A1* | 3/2005 | Kasahara et al. | 331/16 |
| 2007/0152762 A1* | 7/2007 | Hung et al. | 331/16 |
| 2010/0164569 A1* | 7/2010 | Bode et al. | 327/156 |

* cited by examiner

*Primary Examiner* — Kevin M Burd
(74) *Attorney, Agent, or Firm* — Law Office of Gerald Maliszewski; Gerald Maliszewski

(57) ABSTRACT

A system and method are provided for determining a frequency ratio in a phase-locked loop (PLL) circuit feedback path. The method accepts a reference signal having a predetermined first frequency and a PLL output signal having a non-predetermined second frequency. The reference signal cycles are counted, creating a first binary count. Likewise, the PLL output signal cycles are counted, creating a second binary count. The second binary count is sampled at an interval responsive to the first binary count, and a right-shifted second binary count is supplied as a ratio of the second frequency divided by the first frequency. More explicitly, the sampling is performed when a first binary count sampling threshold of $2^n$ first frequency cycles is reached. Then, the radix point in the second binary count is shifted n number of radix places to the left.

18 Claims, 4 Drawing Sheets

Fig. 1 *(PRIOR ART)*
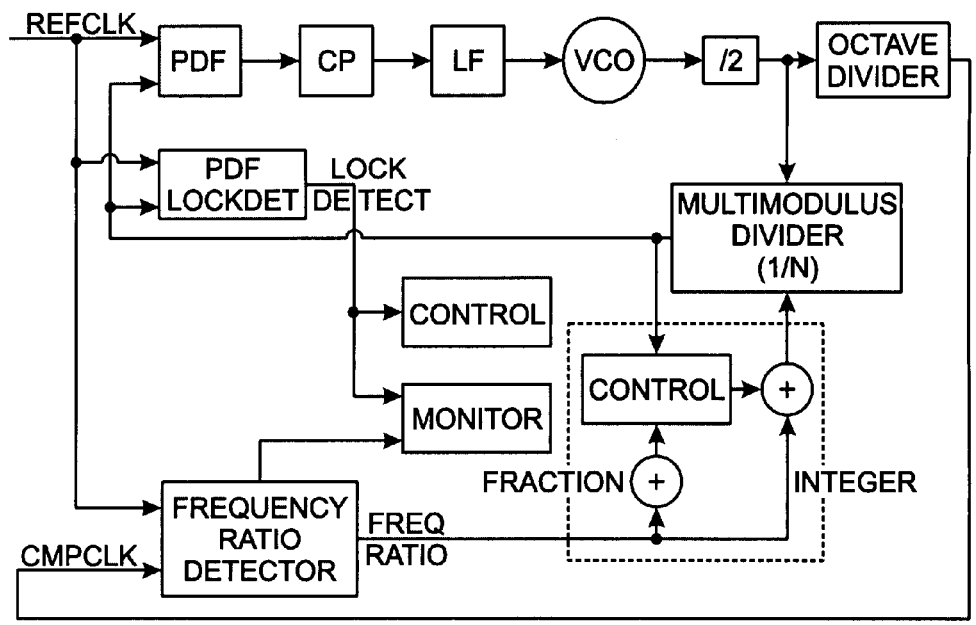
Fig. 2
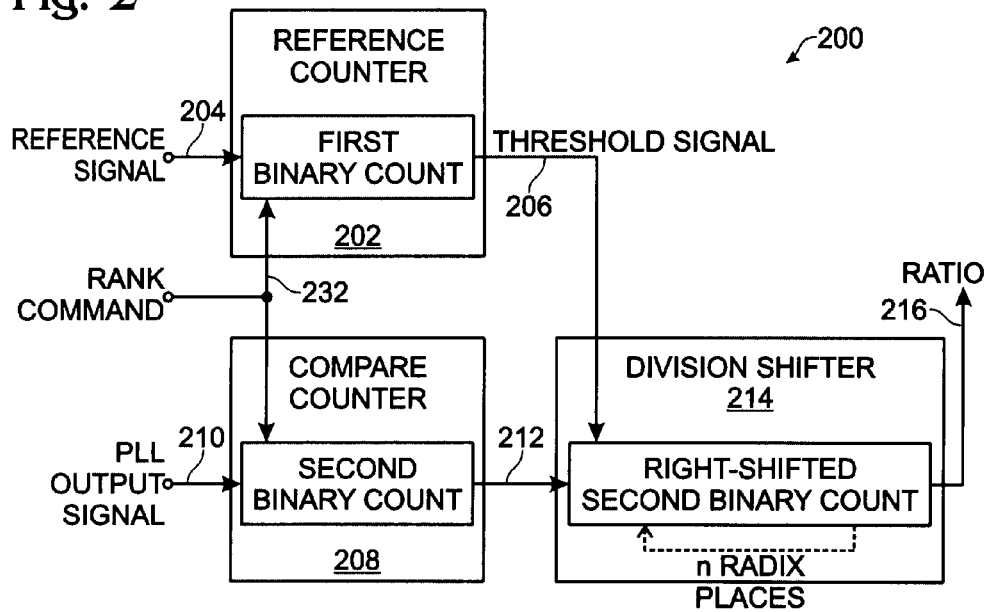

US 8,111,800 B2

FREQUENCY RATIO DETECTION

BACKGROUND OF THE INVENTION

1. Field of the Invention

This invention generally relates to phase-locked loop (PLL) circuitry and, more particularly, to a system and method for determining a division ratio in a fractional-N PLL operating at an undetermined output frequency.

2. Description of the Related Art

Voltage controlled oscillators are commonly used in monolithic clock data recovery (CDR) units, as they're easy to fabricate and provide reliable results. Clock recovery PLLs generally don't use phase-frequency detectors (PFDs) in the data path since the incoming data signal isn't deterministic. PFDs are more typically used in frequency synthesizers with periodic (deterministic) signals. Clock recovery PLLs use exclusive-OR (XOR) based phase detectors to maintain quadrature phase alignment between the incoming data pattern and the re-timed pattern. XOR based phase detectors have limited frequency discrimination capability, generally restricting frequency offsets to less than the closed loop PLL bandwidth. This characteristic, coupled with the wide tuning range of the voltage controlled oscillator (VCO), requires CDR circuits to depend upon an auxiliary frequency acquisition system.

FIG. 1 depicts a PLL loop consisting of a phase frequency detector, a voltage controlled oscillator, a charge pump, and a low-pass filter placed into the forward path of a negative feedback closed loop configuration (prior art). A charge pump is used if the PFD is insufficient to charge (or discharge) reactances in the loops filter.

There are two basic PLL frequency acquisition techniques. The first is a VCO sweep method. During an out-of-lock condition, auxiliary circuits cause the VCO frequency to slowly sweep across its tuning range in search of an input signal. The sweeping action is halted when a zero-beat note is detected, causing the PLL to lock to the input signal. The VCO sweep method is generally used in microwave frequency synthesis applications. The second type of acquisition aid, commonly found in clock recovery circuits, uses a PFD in combination with an XOR phase detector. When the PLL is locked to a data stream, the PLL switches over to a PFD that is driven by a stable reference clock source. The reference clock frequency is proportional to the data stream rate. For example, if the data stream rate is D and the reference clock rate is R, then D α R. However, since the reference clock has only a few rate settings, it is unlikely that R is equal to the receive data rate. To create a reference equal to the data rate a fractional ratio of R must be used; such as D=n/d*R.

In this manner, the VCO frequency is held very close to the data rate. Keeping the VCO frequency in the proper range of operation facilitates acquisition of the serial data and maintains a stable downstream clock when serial data isn't present at the CDR input. When serial data is applied to the CDR, the XOR based phase detector replaces the PFD, and data re-timing resumes.

Returning to FIG. 1, it is common for a PLL to use a divider in the feedback path, so that the PFD can operate at lower frequencies. In the simplest case, the divisor is a fixed integer value. Then, a frequency divider is used to produce an output clock that is an integer multiple of the reference clock. If the divider cannot supply the required divisor, or if the output clock is not an integer multiple of the reference clock, the required divisor may be generated by toggling between two integer values, so that an average divisor results. By placing a fractional divider (1/N) into this feedback path, a fractional multiple of the input reference frequency can be produced at the output of this fractional-N PLL.

However, it is difficult to determine a divisor, either fixed or averaged, if the frequency of the data stream is not known beforehand. For this reason, CDR devices are typically designed to operate at one or more predetermined data stream baud rates.

It would be advantageous if the PLL in a CDR could be designed to work over a broad range of frequencies, even if the exact frequency of the input data stream is unknown.

SUMMARY OF THE INVENTION

Within the context of a fractional-N PLL divide control loop, a system is provided to calculate the finite resolution, fixed-point, frequency ratio between a reference clock and the PLL output frequency. This frequency ratio [integer+fraction] can be used by a fractional frequency synthesizer circuit for noise shaping control of a fractional 1/N divider within the PLL's divide loop. The frequency synthesizer allows the PLL to synthesize fractional multiples of the reference frequency.

Accordingly, a method is provided for determining a frequency ratio in a PLL circuit feedback path. The method accepts a reference signal having a predetermined first frequency and a PLL output signal having a non-predetermined second frequency. The reference signal cycles are counted, creating a first binary count. Likewise, the PLL output signal cycles are counted, creating a second binary count. The second binary count is sampled at an interval responsive to the first binary count, and a right-shifted second binary count is supplied as a ratio of the second frequency divided by the first frequency.

More explicitly, the sampling is performed when a first binary count sampling threshold of $2^n$ first frequency cycles is reached. Then, the radix point in the second binary count is shifted n number of radix places to the left. That is, a second binary count of n bits is provided with a radix point. (n) least significant bits (LSBs) are allocated to a fractional portion of second binary count, creating a second binary count with p number of bits, where p=2n. Then, the second binary count is right shifted n bit places and the n most significant bits (MSBs) can be dropped. The ratio is unsigned, having an integer component and a fractional component.

Additional details of the above-described method and a frequency ratio system for determining a fractional-N ratio in a PLL circuit feedback path are provided below.

BRIEF DESCRIPTION OF THE DRAWINGS

FIG. 1 depicts a PLL loop consisting of a phase frequency detector, a voltage controlled oscillator, a charge pump, and a low-pass filter placed into the forward path of a negative feedback closed loop configuration (prior art).

FIG. 2 is a schematic block diagram depicting a frequency ratio system for determining a ratio in a phase-locked loop (PLL) circuit feedback path.

DETAILED DESCRIPTION

FIG. 2 is a schematic block diagram depicting a frequency ratio system for determining a ratio in a phase-locked loop (PLL) circuit feedback path. The system 200 comprises a reference counter 202 having an input on line 204 to accept a reference signal having a predetermined first frequency. The reference counter 202 counts reference signal cycles, creating a first binary count. The reference counter 202 has a threshold signal output on line 206 with an interval responsive to the first binary count. A compare counter 208 has an input on line 210 to accept a PLL output signal having a non-predetermined second frequency. The compare counter 208 counts PLL output signal cycles, creating a second binary count output on line 212.

A division shifter 214 has an input on line 212 to accept the second binary count and an input on line 206 to accept the threshold signal. The division shifter 214 samples the second binary count in response to the threshold signal, and has an output on line 216 to supply a right-shifted second binary count as a ratio of the second frequency divided by the first frequency.

Figure 3:
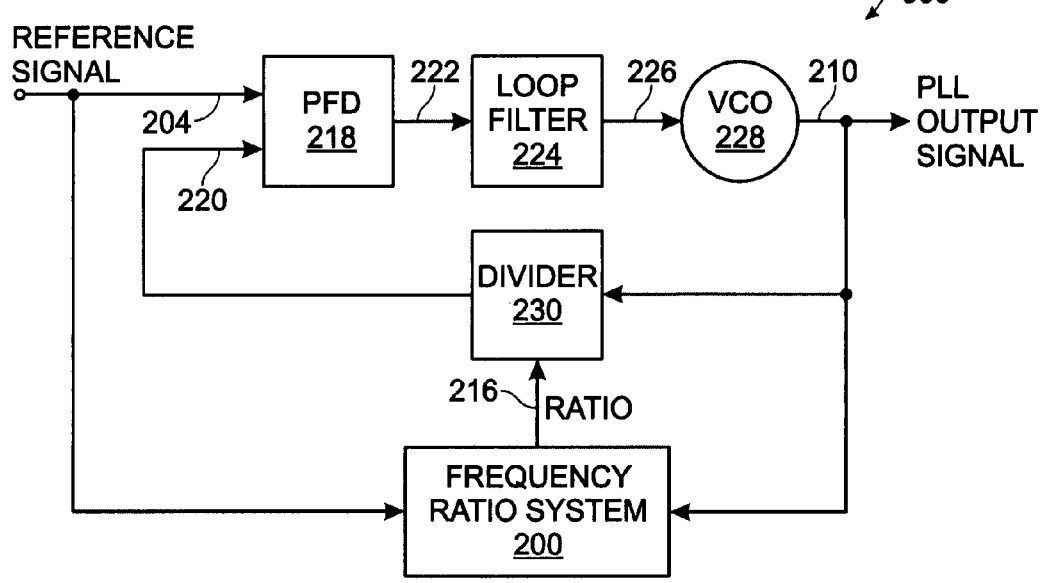
FIG. 3 is a schematic block diagram depicting a fractional-N PLL, incorporating the frequency ration system of FIG. 2.

FIG. 3 is a schematic block diagram depicting a fractional-N PLL 300, incorporating the frequency ratio system of FIG. 2. One exemplary use of the frequency ratio system is in the depicted PLL. A phase-frequency detector (PFD) 218 has inputs on lines 204 and lines 220 to accept the reference signal and a third frequency, respectively, and an output on line 222 to supply a voltage controlled oscillator (VCO) adjust signal. A loop filter 224 has an input on line 222 to accept the VCO adjust signal and an output on line 226 to supply a filtered VCO adjust signal. In some aspects not shown (see FIG. 1), a charge pump may be interposed between the PFD 218 and loop filter 224.

A VCO 228 has an input on line 226 to accept the filtered VCO adjust signal and an output on line 210 to supply the PLL output signal. In other aspects of the PLL (not shown), a ring oscillator or a digital numeric generator may be used in place of the VCO 228. A divider 230 has an input on line 210 to accept the PLL output signal and an input on line 216 to accept the ratio. The divider 230 applies the ratio to the second frequency to supply the third frequency at an output on line 220. For simplicity it is assumed that the divider can perform the conventional frequency synthesis control functions need to create the necessary divisor (see FIG. 1). Even though the PLL output (second) frequency is unknown, the frequency ratio system supplies a ratio that maintains the third frequency, thus, maintaining the second frequency.

As explained in more detail below, other systems (not shown) are tasked with initially acquiring the PLL output second frequency. Since the second frequency is unknown, the ratio is likewise unknown. Thus, the system of FIG. 2 maintains the PLL output second frequency by constantly calculating the unknown ratio.

Returning to FIG. 2, the reference counter 202 supplies a threshold signal on line 206 in response to reaching a first binary count sampling threshold of $2^n$ first frequency cycles. Then, the division shifter 214 shifts a radix point in the second binary count n number of radix places to the left. In mathematics, radix point refers to the symbol used in numerical representations to separate the integral part of the number (to the left of the radix) from its fractional part (to the right of the radix). The radix point is usually a small dot, either placed on the baseline or halfway between the baseline and the top of the numerals.

In other aspect, the reference counter 202 and compare counter 208 each have a rank input on line 232 to accept a command selecting a value of n. Thus, the division shifter 214 supplies the ratio with a resolution responsive to the selected value of n. Alternately stated, the reference counter 202 supplies a threshold signal for sampling the second binary count at a rate equal to $(2^n) \times$(first frequency).

Figure 4:
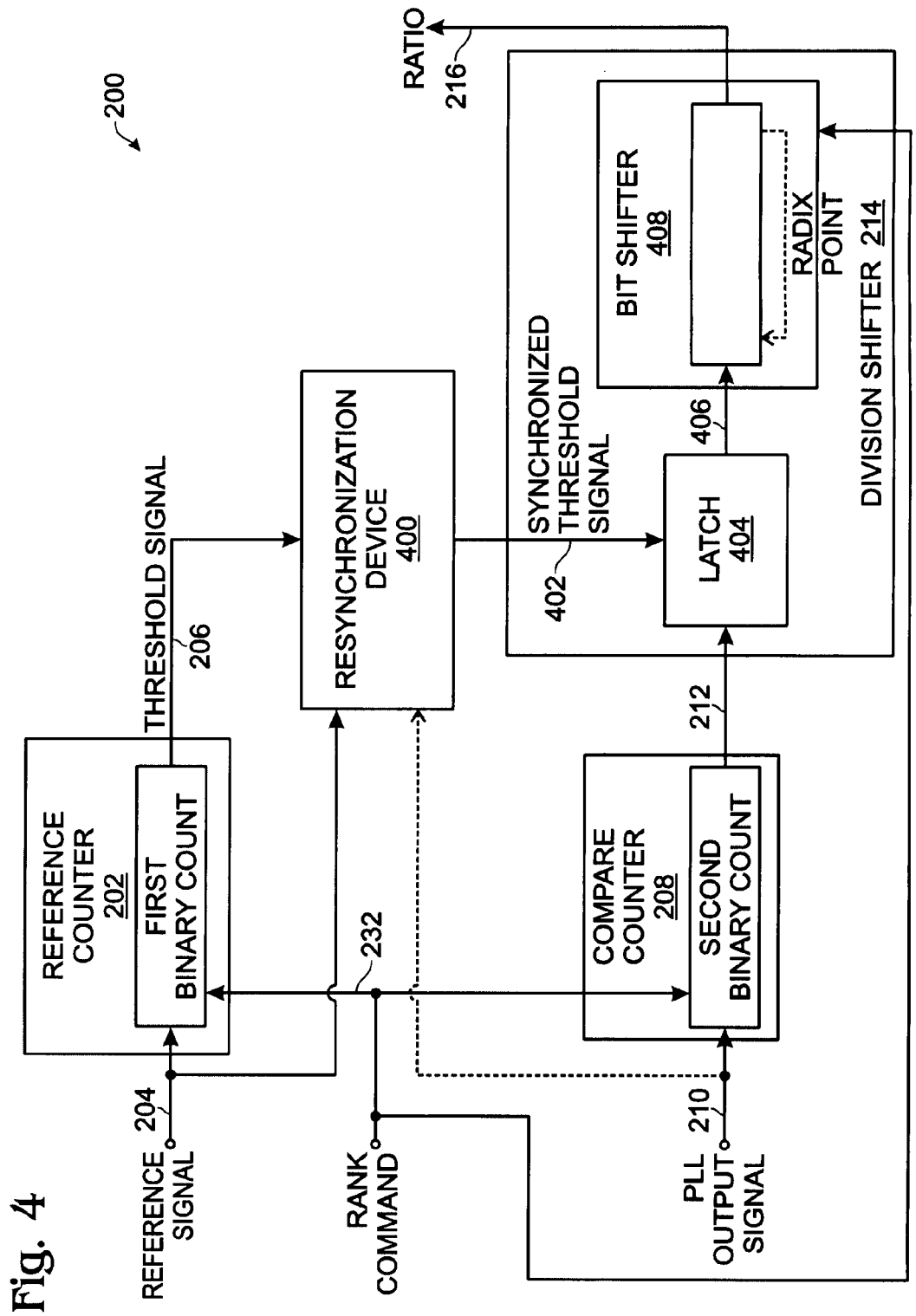
FIG. 4 is a schematic block diagram depicting a more detailed variation of the frequency ratio system of FIG. 2.

FIG. 4 is a schematic block diagram depicting a more detailed variation of the frequency ratio system of FIG. 2. In one aspect, the frequency ratio system 200 further comprises a resynchronization device 400 having an input on line 206 to accept the threshold signal and an input to accept a synchronization signal. The synchronization signal may be either the reference signal, as shown, or the PLL output signal (as seen in phantom). The resynchronization device 400 has an output on line 402 to supply a threshold signal synchronized to the synchronization signal.

In this aspect, the division shifter 214 comprises a latch 404 having an input to accept the second binary count on line 212 and an input on line 402 to accept the synchronized threshold signal. The latch 404 has an output on line 406 to supply a latched second binary count that is synchronized to the syn-chronization signal (either the reference signal or PLL output signal). A bit shifter 408 has an input on line 406 to accept the latched second binary count and a rank input on line 232 to accept a command selecting a value of n. The bit shifter 408 has an output on line 216 to supply the ratio.

The bit shifter sets an initial radix point in the second binary count of n bits and allocates n least significant bits (LSBs) to a fractional portion of the second binary count, creating a second binary count of p bits, where p=2n. The second binary count is right-shifted n bit places and the n most significant bits (MSBs) are removed. The division shifter supplies an unsigned ratio with an integer component and a fractional component.

The radix point must be correctly located in order to identify the integer and fractional components of the ratio. For example:

1) the second binary count=10001 (17 decimal) and the first binary count=10000 (16 decimal), where n=4;
2) after allocating 4 LSBs, (adding 4 bit places to the fractional LSBs), the resulting count is 10001.0000;
3) then, a right shift of n bit places is performed and the resulting count is 00001.0001; and,
4) after removing n MSBs (removing n bits from the integer MSBs), the resulting ratio is 1.0001. In decimal, the ratio is 1 1/16=17/16=1.0625 decimal.

No resolution is added or lost on the shift. Only the bit width of the counter (n+1) dictates the resolution of the resultant count.

Although the system has been explained in the context of a base 2 number system, the same general principles can applied to counters designed for use in other number bases. Further, although the frequency ratio system description implies the use of hardware components, some or all the system may be enabled using software instructions stored in memory that are operated upon by a processor or logic-coded state machine.

Functional Description

The frequency ratio system calculates the finite resolution, fixed-point, frequency ratio between a reference clock and the PLL (VCO) output signal (clock). The frequency ratio system measures the approximate ratio using two simple programmable counters. The programmable rank of a reference counter (RANK) specifies at what count (most significant bit, e.g., $2^{RANK}$) a sampling pulse is generated from the reference counter, which is then used to sample the compare counter count. The rank, therefore, controls the finite resolution by which the frequency ratio is measured. In steady-state operation a reference clock and PLL output signal are provided to the frequency ratio system, and the reference counter reaches the $2^{RANK}$ count in [$2^{RANK}$*Reference Period] seconds. Therefore, the frequency ratio refresh rate is [$2^{RANK}$*Reference Period*Filter Length], where the filter length is the number of consecutive zero-drift measurements of the frequency ratio required to validate the measured ratio. The sampling pulse from the reference counter must be synchronized to the PLL output signal (or reference signal) to ensure that the second binary count bits are sampled correctly.

Some benefits of this circuit implementation are its minimal footprint and simplicity. Since the reference (first binary) count used to sample the compare count is guaranteed to be a multiple of 2, a simple bit-shifting of the sampled second binary count can be used instead of a full fixed-point divider to determine the frequency ratio. To calculate the fixed-point ratio, the second binary count is first bit-shifted left (power of 2 multiplication) by the number of fractional bits needed to meet the required fractional significant bits on the right side of the radix point. The second binary count is then bit-shifted right (power of 2 division) to determine the finite resolution, fixed-point ratio. This methodology is practical since a conventional synthesizer only needs periodic frequency ratio updates in a frequency-hold application.

The fixed-point frequency ratio is recalculated on a continual basis. In one aspect however, the ratio value advertised to external logic like the frequency synthesizer, is only updated once it has been determined that the ratio is calculated within frequency drift thresholds. The second binary count is continually monitored to determine the PPM drift between samplings. If the PLL output (second) frequency drift exceeds the PPM drift limit, the frequency ratio is not updated. This practice ensures that the loop frequencies are stable in the presence of inconsistent data rates. If the actual PLL output frequency is desired, then a fixed-point multiplier may be implemented with the calculated frequency ratio and the reference frequency as inputs.

FREQUENCY RATIO CALCULATION

Definitions:
  W—Time Window (seconds)
  C—Counter Count
  T—Clock Period
  F—Clock Frequency
  Subscript (R)—Reference clock
  Subscript (C)—Compare clock (PLL output)
  $S_{ERR}$—Sampling Error
  $R_{ERR}$—Reset Error
  FR—Frequency Ratio
Frequency Ratio Calculation:
  If, $W_R = W_C$ (assuming that the counters are reset at the same time and no sampling error);
  And,
    $W_R = C_R * T_R$
    $W_C = C_C * T_C$
    Then, $C_C * T_C = C_R * T_R \rightarrow C_C/C_R = T_R/T_C \rightarrow C_C/C_R = F_C/F_R$
    Frequency Ratio (FR)=$F_C/F_R = C_C/C_R$
  But, due to the frequency difference between the compare clock and the reference clock:

$FR = [C_C +/- (S_{ERR} + R_{ERR})]/C_R$.

More generally, the frequency ratio system may be used in a PLL loop implemented in a continuous rate transceiver that can be operated in two modes: Auto-Frequency Acquisition (AFA) mode and Specified-Frequency (SF) mode. In the SF mode, a user can specify the desired steady-state operating frequency of the loop by setting the VCO band select and frequency ratio in the device register file.

Figure 5:
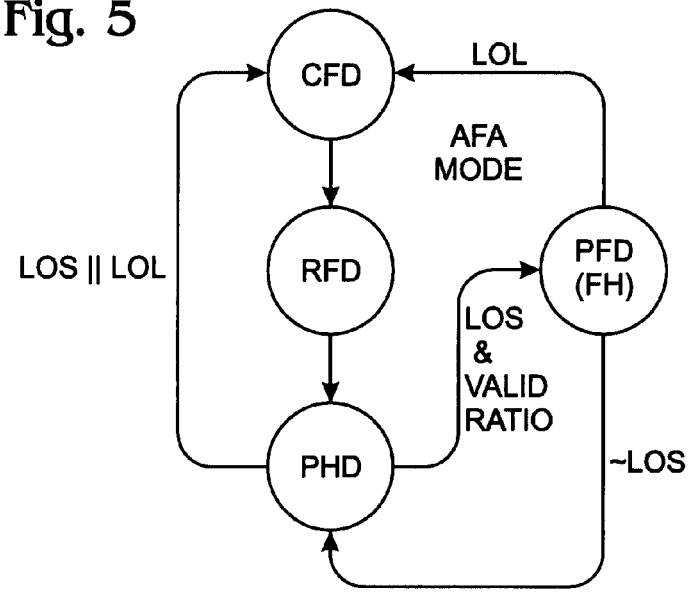
FIG. 5 is an Auto-Frequency Acquisition (AFA) Mode flowchart.

FIG. 5 is an Auto-Frequency Acquisition (AFA) Mode flowchart. In AFA mode, the transceiver detects the data rate of the Received Serial Data (RSD) and automatically matches loop frequency for the data rate by directly selecting the optimal VCO band. The AFA mode can be divided into four sub-modes: Coarse Frequency Detection (CFD), Rotational Frequency Detection (RFD), Phase Detection (PHD), and Phase-Frequency Detection (PFD).

The PFD mode is also know as the Frequency Hold (FH) mode. The FH mode consists of elements common to a typical PLL loop with the addition of the frequency synthesizer (SD) block and the frequency ratio system described herein.

In the feedback path of a typical PLL loop, an integer frequency divider may be added to produce an output clock that is an integer multiple of the reference clock (received serial data rate in this case). By placing a fractional divider (1/N) into this feedback path, a fractional multiple of the input reference frequency can be produced at the output of this fractional-N PLL.

In the first two sub-modes of the AFA mode, CFD and RFD modes, the PLL loop frequency is tuned to closely match the input serial data rate. During the third stage of the AFA mode, PHD mode, the PLL loop is considered locked to the input data rate and phase wander/jitter is closely monitored and compensated. In the context of AFA mode, the loop remains 'locked' to the received data rate as long as the rate remains within the specified PPM requirement.

If a Loss Of Signal (LOS) is detected while in the phase compensation PHD sub-mode, the device as two options: to return to the beginning of the auto-frequency acquisition procedure or to enter a frequency hold state. In a frequency hold state, the last valid recorded frequency is maintained in the hope that data will be reacquired at the same rate.

The last recorded frequency is established in the PHD state and maintained throughout the FH state. Since no serial data is received by the device in a LOS condition, the frequency is maintained using a reference clock. Thus, the intended frequency in FH mode may be described as a 'ratio' of the intended VCO frequency and the reference clock.

Within the context of a fractional-N PLL's divide control loop, the frequency ratio system calculates the finite resolution, fixed-point, frequency ratio between a reference clock and the PLL's VCO clock. This frequency ratio [integer+fraction] is used by a fractional frequency synthesizer circuit for noise shaping control of a fractional 1/N divider within the PLL's divide loop. The frequency synthesizer allows the PLL to synthesize fractional multiples of the reference frequency.

Since the reference clock is at a fixed, user specified frequency and the received data rate can be any rate within the device rate compensation limits, a fractional divide circuit is required in the PLL's feedback path in FH mode. In one aspect, the frequency ratio that is sent to the frequency synthesizer divider is represented as 7 bits of integer and 24 bits of fractional data, however, the total number of bits, or the allocation of bits may vary.

Figure 6:
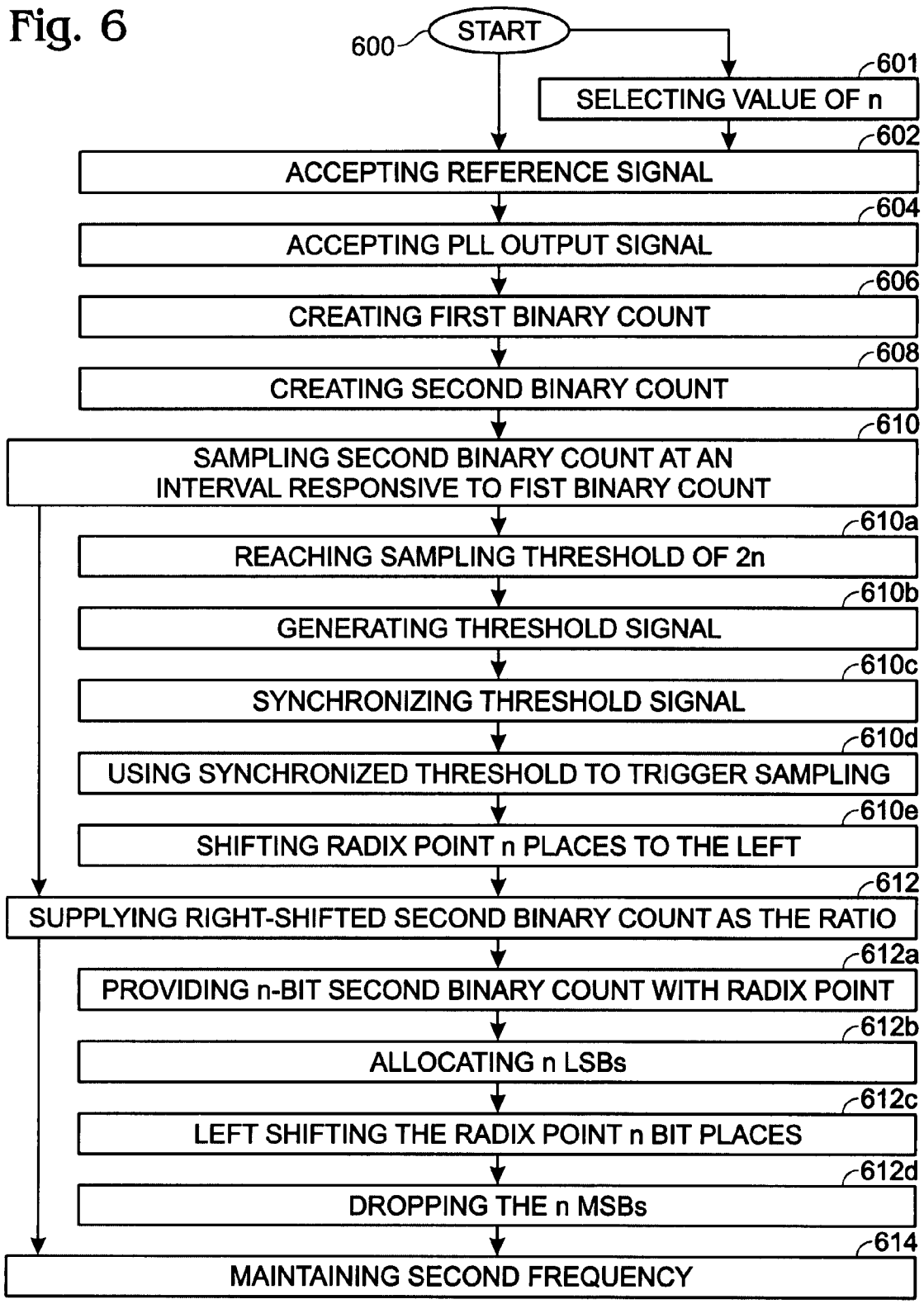
FIG. 6 is a flowchart illustrating a method for determining a frequency ratio in a PLL circuit feedback path.

FIG. 6 is a flowchart illustrating a method for determining a frequency ratio in a PLL circuit feedback path. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 600.

Step 602 accepts a reference signal having a predetermined first frequency. Step 604 accepts a PLL output signal having a non-predetermined second frequency. Step 606 counts reference signal cycles, creating a first binary count. Step 608 counts PLL output signal cycles, creating a second binary count. Step 610 samples the second binary count at an interval responsive to the first binary count. Step 612 supplies a right-shifted second binary count as a ratio of the second frequency divided by the first frequency. Step 614 maintains the second frequency using the ratio.

In one aspect, accepting the PLL output signal having the second frequency in Step 602 includes supplying the PLL output signal responsive to the difference between the first frequency and a third frequency in a PLL feedforward path. Then maintaining the second frequency in Step 614 includes dividing the PLL output signal by the ratio to supply the third frequency in a PLL feedback path.

In another aspect, sampling the second binary count at the interval responsive to the first binary count in Step 610 includes substeps. Step 610a reaches a first binary count sampling threshold of $2^n$ first frequency cycles. Step 610e shifts a radix point in the second binary count n number of radix places to the left.

In one aspect, Step 601 accepts a (rank) command selecting a value of n. Then, supplying the right-shifted second binary count as the ratio of the second frequency divided by the first frequency in Step 612 includes supplying the ratio with a resolution responsive to the selected value of n. Alternately expressed, sampling the second binary count at the interval responsive to the first binary count in Step 610 includes sampling at a rate equal to $(2^n) \times (\text{first frequency})$.

In a different aspect, Step 610 includes additional substeps. Subsequent to reaching the first binary count sampling threshold, Step 610b generates a threshold signal, and Step 610c synchronizes the threshold signal to the PLL output signal. Then, Step 610d uses the synchronized threshold signal to trigger the sampling of the second binary count.

In one aspect, supplying a right-shifted second binary count as the ratio of the second frequency divided by the first frequency (Step 612) includes substeps. Step 612a provides a second binary count of n bits with a radix point. Step 612b allocates n LSBs to the fractional portion of second binary count, creating a second binary count of p bits, where p=2n. Step 612c left shifts the radix point n bits places. Step 612d drops the n MSBs. The right-shifted second binary count supplied in Step 612 is an unsigned ratio having an integer component and a fractional component.

A system and method have been provided for determining a frequency ratio in a PLL feedback path. The system and method are not merely limited to the examples presented to illustrate the invention. Other variations and embodiments of the invention will occur to those skilled in the art.

I claim:

1. in a phase-locked loop (PLL) circuit feedback path, a method for determining a frequency ratio, the method comprising:
   accepting a reference signal having a predetermined first frequency in a reference counter;
   accepting a PLL output signal having a non-predetermined second frequency in a compare counter;
   counting reference signal cycles, creating a first binary count;
   counting PLL output signal cycles, creating a second binary count;
   sampling the second binary count at an interval responsive to the first binary count in a division shifter, as follows:
      reaching a first binary count sampling threshold of $2^n$ first frequency cycles;
      allocating radix places to the right of a radix point in the second binary count; and,
      shifting the radix point in the second binary count n number of radix places to the left; and,
   supplying a right-shifted second binary count as a ratio of the second frequency divided by the first frequency.

2. The method of claim 1 further comprising:
   maintaining the second frequency using the ratio.

3. The method of claim 2 wherein accepting the PLL output signal having the second frequency includes, in a PLL feedforward path, supplying the PLL output signal responsive to the difference between the first frequency and a third frequency; and,
   wherein maintaining the second frequency includes, in a PLL feedback path, dividing the PLL output signal by the ratio to supply the third frequency.

4. The method of claim 1 further comprising:
   accepting a command selecting a value of n; and,
   wherein supplying the right-shifted second binary count as the ratio of the second frequency divided by the first frequency includes supplying the ratio with a resolution responsive to the selected value of n.

5. The method of claim 1 wherein sampling the second binary count at the interval responsive to the first binary count includes sampling at a rate equal to $(2^n) \times (\text{first frequency})$.

6. The method of claim 1 wherein sampling the second binary count at the interval responsive to the first binary count includes:
   subsequent to reaching the first binary count sampling threshold, generating a threshold signal;
   synchronizing the threshold signal to the PLL output signal; and,
   using the synchronized threshold signal to trigger the sampling of the second binary count.

7. The method of claim 1 wherein supplying a right-shifted second binary count as the ratio of the second frequency divided by the first frequency includes:
   providing a second binary count of n bits with a radix point
   allocating n least significant bits (LSBs) to a fractional portion of second binary count, creating a second binary count of p bits, where p=2n;
   left shifting the radix point n bit places; and,
   dropping the n most significant bits (MSBs).

8. The method of claim 1 wherein supplying the right-shifted second binary count as the ratio of the second frequency divided by the first frequency includes supplying an unsigned ratio having an integer component and a fractional component.

9. In a phase-locked loop (PLL) circuit feedback path, a frequency ratio system for determining a ratio, the frequency ratio system comprising:
   a reference counter having an input to accept a reference signal having a predetermined first frequency, the reference counter counting reference signal cycles, creating a first binary count, and having a threshold signal output with an interval responsive to the first binary count;
   a compare counter having an input to accept a PLL output signal having a non-predetermined second frequency, the compare counter counting PLL output signal cycles, creating a second binary count output;
   a division shifter having an input to accept the second binary count and an input to accept the threshold signal, the division shifter sampling the second binary count in response to the threshold signal, and having an output to supply a right-shifted second binary count as a ratio of the second frequency divided by the first frequency;

wherein the reference counter supplies a threshold signal in response to reaching a first binary count sampling threshold of $2^n$ first frequency cycles; and wherein the division shifter allocates n radix places to the right of a radix point in the second binary count and shifts the radix point n number of radix places to the left.

10. The system of claim 9 further comprising:
a phase-frequency detector having inputs to accept the reference signal and a third frequency, and an output to supply a voltage controlled oscillator (VCO) adjust signal;
a loop filter having an input to accept the VCO adjust signal and an output to supply a filtered VCO adjust signal;
a VCO having an input to accept the filtered VCO adjust signal and an output to supply the PLL output signal;
a divider having an input to accept the PLL output signal and an input to accept the ratio, the divider applying the ratio to the second frequency to supply the third frequency at an output.

11. The system of claim 10 wherein the frequency ratio system supplies a ratio that maintains the second frequency.

12. The system of claim 9 wherein the reference and compare counters each have a rank input to accept a command selecting a value of n; and,
wherein the division shifter supplies the ratio with a resolution responsive to the selected value of n.

13. The system of claim 9 wherein the reference counter supplies a threshold signal for sampling the second binary count at a rate equal to $(2^n) \times$(first frequency).

14. The system of claim 9 wherein the frequency ratio system further comprises:
a resynchronization device having inputs to accept the threshold signal and a synchronization signal selected from a group consisting of the PLL output signal and the reference signal, and an output to supply a threshold signal synchronized to the synchronization signal;
wherein the division shifter comprises:
a latch having inputs to accept the second binary count and the synchronized threshold signal, and an output to supply a latched second binary count synchronized to the synchronization signal; and,
a bit shifter having an input to accept the latched second binary count, a rank input to accept a command selecting a value of n, and an output to supply the ratio.

15. The system of claim 14 wherein the bit shifter sets an initial radix point in the second binary count of n bits, allocates n least significant bits (LSBs) to a fractional portion of the second binary count, creating a second binary count of p bits, where p=2n, right-shifts the second binary count n bit places, and removes the n most significant bits (MSBs), 16. The system of claim 9 wherein the division shifter supplies an unsigned ratio with an integer component and a fractional component.

17. In a phase-locked loop (PLL) circuit feedback path, a frequency ratio system for determining a ratio, the frequency ratio system comprising:
a reference counter having an input to accept a reference signal having a predetermined first frequency, the reference counter counting reference signal cycles, creating a first binary count, and having a threshold signal output with an interval responsive to the first binary count;
a compare counter having an input to accept a PLL output signal having a non-predetermined second frequency, the compare counter counting PLL output signal cycles, creating a second binary count output; and,
a division shifter having an input to accept the second binary count and an input to accept the threshold signal, the division shifter sampling the second binary count in response to the threshold signal, and having an output to supply a right-shifted second binary count as a ratio of the second frequency divided by the first frequency;
a phase-frequency detector having inputs to accept the reference signal and a third frequency, and an output to supply a voltage controlled oscillator (VCO) adjust signal;
a loop filter having an input to accept the VCO adjust signal and an output to supply a filtered VCO adjust signal;
a VCO having an input to accept the filtered VCO adjust signal and an output to supply the PLL output signal;
a divider having an input to accept the PLL output signal and an input to accept the ratio, the divider applying the ratio to the second frequency to supply the third frequency at an output.

18. The system of claim 17 herein the reference counter supplies a threshold signal in response to reaching a first binary count sampling threshold of $2^n$ first frequency cycles; and,
wherein the division shifter allocated n radix places to the right of a radix point in the second binary count and shifts n number of radix places to the left.

* * * * *